Dec. 16, 1958 J. C. ACHENBACH 2,864,946

FINE TUNING CONTROL SYSTEM FOR TELEVISION RECEIVERS
HAVING SAME RANGE ON EACH CHANNEL
Filed July 16, 1956

INVENTOR.
John C. Achenbach
BY H. L. Newton
ATTORNEY.

2,864,946
Patented Dec. 16, 1958

2,864,946

FINE TUNING CONTROL SYSTEM FOR TELEVISION RECEIVERS HAVING SAME RANGE ON EACH CHANNEL

John C. Achenbach, Haddonfield, N. J., assignor to Radio Corporation of America, a corporation of Delaware Application July 16, 1956, Serial No. 597,982
1 Claim. (Cl. 250—20)

This invention relates generally to high frequency tuning control systems and more particularly to fine tuning control systems for television receiver tuners and the like.

Tuners for signal receivers such as television receivers which have a step-by-step main tuning selector means are also generally provided with a separate fine tuning control means. Due to the inherent design of most tuners of this type, the range of frequencies over which the fine tuning control means is operable is not the same for all setting of the main tuning selector means. In television receivers, for example, it is often found that the fine tuning range for certain channels is much wider than necessary and that the usable and effective portion of the range is relatively small. Thus for a predetermined change in reactance of the fine tuning control means, the frequency change is greater and the adjustment becomes critical.

This is of particular importance with respect to color television reception since for proper operation the received carrier frequency should be precisely set to operate on a specific portion of the intermediate frequency selectivity curve. Furthermore, in television receivers it is desirable that the fine tuning range be limited to the useful portion thereof so that there is always some apparent reception when the main tuning selector means is tuned to a desired channel frequency. If the fine tuning control is incorrectly set, the operator may not realize why there is no picture and attempt to remedy the situation by readjusting the settings of other controls thereby causing unnecessary bother and inconvenience.

It is an object of this invention to provide an improved fine tuning control means for receivers such as television receivers which provides the optimum fine tuning range for each position of the main tuning selector means.

It is a further object of this invention to provide an improved fine tuning control system for television receivers which is simple in construction, and which may be easily manufactured in large quantities at low cost and is operable to control the fine tuning range for each television channel setting over a predetermined range of frequencies.

The fine tuning control system of the invention includes a variable reactance device such as a variable capacitor which is controlled in part by the main tuning selector control and in part by the fine tuning control member. The variable capacitor includes a first and a second capacitor plate which are suitably connected in the tuner circuit to control the tuning thereof. The fine tuning control member operates to change the position of the first capacitor plate relative to the second to vary the capacitance therebetween. The position of the second capacitor plate is controlled by the main tuning selector, so that when the main tuning selector is set to receive different channels, the position of the second capacitor plate is changed to provide a different portion thereof in registry with the first plate. By suitably slotting or otherwise forming the second capacitor plate, the maximum or minimum area of registry between the plates may be controlled to provide a variation in capacitance which enables the optimum fine tuning range for any position of the main tuning selector means.

The novel features that are considered characteristic of this invention are set forth with particularity in the appended claim. The invention itself, however, both as to its organization and method of operation, as well as additional objects and advantages thereof, will best be understood from the following description when read in connection with the accompanying drawing, in which:

Figure 1:
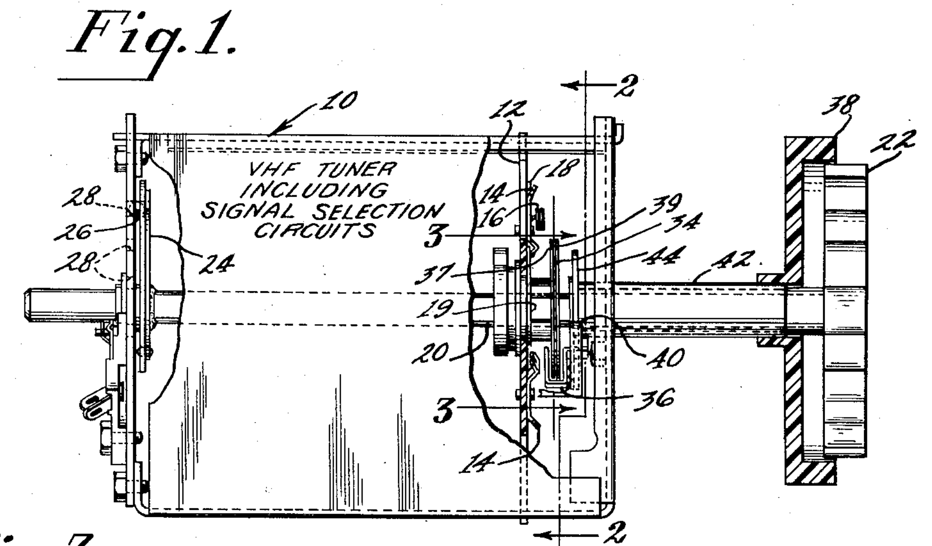
Figure 1 is a side elevational view, partly broken away to show certain constructional details, of a television tuner having a fine tuning control system in accordance with the invention.
Figures 2, 3, 4:
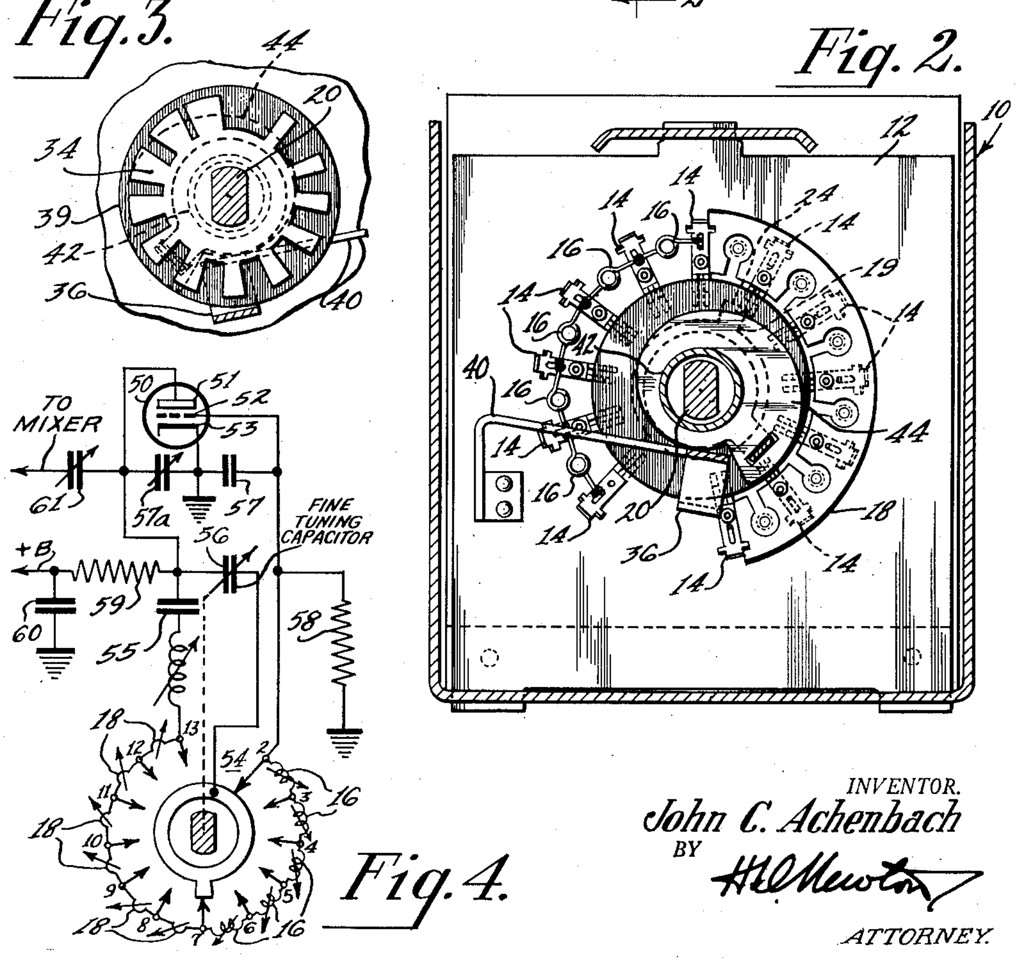
Figure 2 is an enlarged sectional view of the tuner shown in Figure 1 taken on the section lines 2—2.
Figure 3 is an enlarged sectional view, partly broken away, of the tuner of Figure 1 taken on the section lines 3—3.
Fig. 4 is a schematic circuit diagram of a high frequency local oscillator for a television receiver or the like, showing how the fine tuning control system of the invention may be used.

Referring now to the drawings, wherein like reference numerals are used to designate similar components throughout, and particularly to Figures 1 to 3, the television tuner shown is a very high frequency (V. H. F.) tuner having twelve channel selecting positions, one for each of the V. H. F. television channels 2 to 13. The various V. H. F. tuning circuits are supported in a housing 10, a portion of which is broken away in Figure 1 to show the oscillator tuning circuit.

The oscillator tuning circuit is mounted on an insulating support 12 which has a plurality of radially extending contact elements 14 mounted thereon. A plurality of lumped inductors 16 are connected between the first six contact elements, and an inductor provided by an arcuate conductor 18 with notches to control path length is connected between the remaining contact elements. A rotor element 19 is mounted on a main tuning control shaft 20, and is adapted to make electrical contact with the contact elements 14 so that the desired inductance may be connected in circuit to tune the oscillator to the proper frequency for receiving signals in the various channels.

The main tuning control shaft 20 is mounted for rotation between the end walls of the tuner housing 10 and has a main tuning selector knob 22 affixed to the forward end thereof. A detent mechanism is connected to the other end of the shaft 20 near the rear of the tuner housing 10 to insure proper positioning of the rotor elements for the tuning circuits. The detent mechanism includes a spring arm 24 which is fastened to the shaft 20, and a ball bearing 26 which is held in place by the spring arm 24. A plurality of apertures 28 of slightly smaller dimension than the ball bearing 26 are provided in the path of the ball bearing 26 at the proper stop positions. Thus when the ball bearing 26 drops into one of the apertures, the main tuning control shaft 20 is held in the proper tuning position.

The fine tuning control element for the tuner is a variable capacitor having a first plate 34 the position of which is controlled by the main tuning selector knob 22, and a second plate 36 which is controlled by a fine tuning control knob 38. The first capacitor plate 34 is mounted on the main tuning control shaft 20, so that a different portion thereof is brought into registry with the second plate 36 for each channel selecting position. The second capacitor plate 36 comprises a U-shaped extension on a conductive spring arm 40 which is mounted on the insulating support 12. The separate arms of the U-shaped capacitor plate 36 extend on opposite sides of the plate 34. To prevent the capacitor plates 34 and 36 from shorting together, the plate 34 may be sandwiched between a pair of thin insulating wafers 37 and 39.

The plate 34 is electrically connected to the rotor element 19 on the main tuning shaft 20. The U-shaped plate 36 and the spring arm 40 may be formed of a single strip of conductive material so that connections may be made to the plate 36 through the spring arm 40.

The fine tuning control knob 38, in effecting a capacity variation between the plates 34 and 36, causes the capacitor plate 36 (U-shaped extension of the spring arm 40) to move relative to the capacitor plate 34. To accomplish this the fine tuning control knob 38 is mounted on a fine tuning shaft 42 concentrically surrounding the main tuning control shaft 20. A cam member 44 is mounted on the free end of the fine tuning control shaft 42, just inside the front wall of the tuner housing 10. The cam member is positioned so that the eccentric periphery thereof bears against an extension or tab on the capacitor plate 36.

As the fine tuning control knob is rotated counterclockwise from the position shown in Figure 2, the cam member 44 depresses the capacitor plate 36 against the spring pressure of the spring arm 40 to provide a change in the area of registry, and corresponding capacitance change between the two plates. To control the range of frequencies over which the fine tuning control system will be operable, the capacitor plate 34 is slotted or otherwise formed so that for each channel position the ratio of minimum to maximum area of registry of the plate 34 with the plate 36 will provide the proper range of capacity to establish the desired tuning range. As can be seen by reference to Figure 3, the capacitor plate 34 has a plurality of tabs of differing sizes or areas, one for each of the twelve V. H. F. channel selecting positions. When the main tuning selector is set to a predetermined channel, a predetermined one of the tabs is brought into registry with the U-shaped plate 36. The area of the tab on the plate 34 determines the capacitance range of the fine tuning capacitor and hence the range of frequencies over which the fine tuning control system is operable.

Referring now to Figure 4, the television receiver oscillator circuit includes an oscillator tube 50 which has an anode 51, a control grid 52 and a cathode 53. If desired, the oscillator tube may be contained in the same envelope as the mixer tube as in a 6X8 or 6U8 type tube, by way of example. The oscillator is a modified Colpitts type and provides a signal for heterodyning the received V. H. F. television signal to a corresponding intermediate frequency before further amplification in the receiver intermediate frequency amplifier.

The oscillator tank circuit includes the inductors 16—18 which are positioned between the contact terminals of a switch section 54, and is connected in circuit between the anode 51 and the control grid 52. A capacitor 55 is connected between the anode 51 and the inductor 18 to block a D. C. potential from the switch section 54 and also to permit a larger inductance to be put on the switch, since the effect of a series capacitance is equal and opposite to that of an inductance, and therefore additional inductance is required to overcome the effect of the capacitor. The inductors 16 and 18 resonate primarily with the capacitors 56, 57 and **57*a* together with the interelectrode capacitances of tube 50. The capacitor 56 provides a fine tuning control of the oscillator frequency in accordance with the invention while the capacitor 57 supplements the inherent grid-cathode capacity of the oscillator tube 50. It can be noted that one plate 34 of the fine tuning capacitor 56 is physically connected with the rotor element of the switch section 54**, for rotation therewith as described hereinabove.

A grid resistor 58 provides a D. C. return path from the control grid 52 to the cathode 53. Operating potential is supplied to the anode 51 through a load resistor 59 which keeps the power supply from loading the oscillator, and a capacitor 60 serves to bypass oscillator signals to ground.

A predetermined amount of oscillator injection from the oscillator tank circuit to the mixer input circuit is provided by the coupling capacitor 61 which is made adjustable to allow variation in the amount of injection.

The oscillator signal energy conveyed to a mixer tube, not shown, is heterodyned with the received V. H. F. television signal in the mixer tube to produce a corresponding difference or I. F. signal in an output circuit of the mixer.

By varying the capacitance of the fine tuning capacitor, the received carrier wave may be made to operate on a predetermined portion of the selectivity curve of the intermediate frequency circuits of the receiver. By varying the maximum to minimum limits of the fine tuning capacitor, it is possible to use substantially the entire range of rotation of the fine tuning control knob 38 to advantage in providing fine tuning for the receiver. In other words the fine tuning control operates to vary the frequency of the oscillator circuit over only the usable and effective frequency range thereby enabling easier fine tuning of the receiver.

In accordance with the invention a fine tuning control system is provided which includes a variable capacitor which is controlled by both the main tuning selector and the fine tuning control means, and is operative to produce a capacitance variation for optimum fine tuning for each signal frequency to be received. This enables an unskilled operator to easily obtain the exact fine tuning of a receiver such as a television receiver without inconvenience or bother.

What is claimed is:

A fine tuning control system, for television receivers of the type having tunable signal selection circuits for selecting any one of a plurality of V. H. F. television signals, a local oscillator having a tunable oscillator circuit connected in said receiver providing an oscillator signal for mixing with a selected V. H. F. television signal to convert said selected V. H. F. television signal to a corresponding intermediate frequency signal, uni-control means for tuning said signal selection and oscillator circuits including a front panel channel selector knob mounted on a rotatable main tuning control shaft, and a detent mechanism connected with said main tuning control shaft for providing a plurality of channel selecting stop positions and step-by-step selection of any one of said plurality of television channels; comprising a front panel fine tuning knob mounted on a rotatable fine tuning control shaft, a variable capacitor having first and second relatively movable parallel plates, said first plate comprising a substantially circular conductive disc having a plurality of radially extending notches defining a plurality of different plate portions, means including a resilient spring arm rigidly mounted at one end thereof and supporting said second plate at the other end thereof in registry with one of said plate portions of said first plate, means mounting said first plate on said main tuning control shaft for rotation therewith to bring different ones of said plate portions into registry with said second plate for different stop positions of said main tuning control shaft, cam means mounted on said fine tuning control shaft for rotation therewith, the periphery of said cam means being in engagement with said spring arm whereby rotation of said fine tuning knob operates to move said second plate to change the area of registry between said first and second plates, the different plate portions of said first plate being of a dimension to provide maximum to minimum capacitance ratios for optimum fine tuning control for any one of said plurality of television channels, and means connecting said first and second capacitor plates with said tunable oscillator to vary the frequency thereof with rotation of said fine tuning knob.

References Cited in the file of this patent

UNITED STATES PATENTS

| | | |
|---|---|---|
| 1,538,472 | Crosley | May 19, 1925 |
| 1,904,165 | Mullner | Apr. 18, 1933 |
| 2,562,263 | Ehrlich | July 31, 1951 |
| 2,768,300 | Thias | Oct. 23, 1956 |